(12) United States Patent
Bucur et al.

(10) Patent No.: US 8,278,876 B2
(45) Date of Patent: Oct. 2, 2012

(54) BATTERY PACK CURRENT MONITORING

(75) Inventors: Constantin Bucur, Santa Clara, CA (US); Marian Niculae, San Jose, CA (US)

(73) Assignee: O2Micro, Inc., Santa Clara, CA (US)

( * ) Notice: Subject to any disclaimer, the term of this patent is extended or adjusted under 35 U.S.C. 154(b) by 0 days.

(21) Appl. No.: 11/235,583

(22) Filed: Sep. 26, 2005

(65) Prior Publication Data
US 2006/0197499 A1 Sep. 7, 2006

Related U.S. Application Data

(60) Provisional application No. 60/659,330, filed on Mar. 7, 2005.

(51) Int. Cl.
*H02J 7/00* (2006.01)

(52) U.S. Cl. ......... 320/112; 320/134; 320/150; 320/154

(58) Field of Classification Search .................. 320/114, 320/112, 127, 134, 136, 150, 154
See application file for complete search history.

(56) References Cited

U.S. PATENT DOCUMENTS

| | | | |
|---|---|---|---|
| 4,521,741 A * | 6/1985 | Ruberl | 330/277 |
| 4,636,705 A * | 1/1987 | Bowman | 322/28 |
| 5,089,821 A | 2/1992 | Mori et al. | |
| 5,650,753 A | 7/1997 | Ling | |
| 5,712,568 A | 1/1998 | Flohr et al. | |
| 5,914,606 A | 6/1999 | Becker-Irvin | |
| 5,990,659 A | 11/1999 | Frannhagen | |
| 6,084,478 A * | 7/2000 | Mayampurath | 330/308 |
| 6,140,820 A | 10/2000 | James | |
| 6,407,579 B1 | 6/2002 | Goswick | |
| 6,411,097 B1 | 6/2002 | Ashtiani et al. | |
| 6,417,646 B1 | 7/2002 | Huykman et al. | |
| 6,577,883 B1 * | 6/2003 | Ueda | 455/573 |
| 7,495,657 B2 | 2/2009 | Cheng | |
| 2003/0096158 A1 * | 5/2003 | Takano et al. | 429/90 |
| 2003/0107347 A1 * | 6/2003 | Yoshizawa et al. | 320/150 |
| 2004/0124879 A1 | 7/2004 | Narwal | |
| 2005/0024337 A1 | 2/2005 | Cheng | |
| 2005/0134232 A1 * | 6/2005 | Yamamoto | 320/150 |
| 2005/0280393 A1 * | 12/2005 | Feldmann | 320/114 |

(Continued)

FOREIGN PATENT DOCUMENTS

TW        472451 B        1/2002

(Continued)

OTHER PUBLICATIONS

English translation of Chinese Office Action received in Chinese Patent Application No. 2006100568388 dated Feb. 1, 2008.

(Continued)

*Primary Examiner* — Nguyen Tran
(74) *Attorney, Agent, or Firm* — SNR Denton US LLP

(57) ABSTRACT

A battery pack may include at least one battery cell, a switch having an ON resistance dependent on a temperature of the switch, a thermistor having a resistance varying with changes in the temperature, and battery state monitoring circuitry. The battery state monitoring circuitry may be configured to monitor a voltage drop across the switch caused by a current flowing through the switch and the resistance of the thermistor to correlate the voltage drop to the current level. A cordless electrical device including the battery pack, and an associated method are also provided.

14 Claims, 3 Drawing Sheets

U.S. PATENT DOCUMENTS

2006/0006840 A1     1/2006    Furukawa
2006/0186857 A1*    8/2006    Matty et al. .................. 320/122

FOREIGN PATENT DOCUMENTS

TW             506191 B      10/2002

OTHER PUBLICATIONS

English translation of Taiwanese Office Action dated Nov. 7, 2007 received in corresponding Taiwan Application No. 095104657 (8 pages).

English Translation of Chinese Office Action received in corresponding Chinese Application No. 2006200568373 on Oct. 15, 2007 (4 pages).

English translation of Chinese Office Action issued in related Chinese Patent Application No. 2006100568369 received Jan. 4, 2008 (1 page).

U.S. Office Action dated Jun. 12, 2008 issued in related U.S. Appl. No. 11/234,908.

U.S. Office Action dated Jan. 5, 2009 issued in related U.S. Appl. No. 11/234,908.

Notice of Allowance Office Action dated Jul. 17, 2009 issued in related U.S. Appl. No. 11/234,908.

U.S. Office Action dated Nov. 26, 2007 issued in related U.S. Appl. No. 11/264,768.

U.S. Office Action dated Aug. 5, 2008 issued in related U.S. Appl. No. 11/264,768.

U.S. Office Action dated Jul. 20, 2009 issued in related U.S. Appl. No. 11/264,768.

U.S. Office Action dated Jan. 7, 2009 issued in related U.S. Appl. No. 11/264,768.

Notice of Allowance from related U.S. Appl. No. 11/234,908 mailed Dec. 28, 2009.

Office Action from related U.S. Appl. No. 12/729,475 mailed Jun. 11, 2010.

Notice of Allowance from related U.S. Appl. No. 12/729,475 mailed Oct. 18, 2010.

Office Action from related U.S. Appl. No. 12/729,492 mailed Jun. 10, 2010.

Office Action from related U.S. Appl. No. 11/264,768 mailed Dec. 8, 2009.

Office Action from related U.S. Appl. No. 11/264,768 mailed Oct. 13, 2010.

Notice of Allowance dated Dec. 22, 2010 issued in related U.S. Appl. No. 12/729,475.

Office Action dated Dec. 10, 2010 issued in related U.S. Appl. No. 12/729,492.

Notice of Allowance dated Apr. 1, 2011 issued in related U.S. Appl. No. 11/264,768.

U.S. Office Action dated Sep. 9, 2012 issued in related U.S. Appl. No. 12/729,492.

* cited by examiner

BATTERY PACK CURRENT MONITORING

CROSS REFERENCE TO RELATED APPLICATIONS

This application claims the benefit of the filing date of U.S. Provisional Application Ser. No. 60/659,330, filed Mar. 7, 2005, the teachings of which are incorporated herein by reference.

FIELD

The present disclosure relates to a battery pack for cordless electrical devices, and more particularly to battery pack current monitoring.

BACKGROUND

Various cordless electrical devices may be powered by a battery pack. Examples of such cordless electrical devices include, but are not limited to, laptop computers, cell phones, personal digital assistants, and power tools such as a drill. The battery pack may include a plurality of battery cells and power switches to allow the battery cells to either supply current (discharge operation mode) or to be charged (charge operation mode). The battery pack may also include battery state monitoring circuitry powered by the battery cells to perform of number of tasks to maintain a safe and desired use of the battery cells.

In a conventional battery pack, a current sense resistor may be utilized in series with the battery cells of the battery pack to provide a signal to the battery state monitoring circuitry representative of current from or to the battery cells. The use of the current sense resistor may be acceptable for low current applications. However, for high current applications the current sense resistor may cause excessive power dissipation. In addition, the current sense resistor contributes an additional component and connection cost. Accordingly, there is a need to provide for battery pack current monitoring without using a current sense resistor.

BRIEF SUMMARY OF THE INVENTION

According to one aspect of the invention, there is provided a battery pack. The battery pack may include at least one battery cell, a switch having an ON resistance dependent on a temperature of the switch, a thermistor having a resistance varying with changes in the temperature, and battery state monitoring circuitry. The battery state monitoring circuitry may be configured to monitor a voltage drop across the switch caused by a current flowing through the switch and the resistance of the thermistor to correlate the voltage drop to the current.

According to another aspect of the invention, there is provided a cordless electrical device. The cordless electrical device may include a load and a battery pack to provide power to the load. The battery pack may include at least one battery cell, a switch having an ON resistance dependent on a temperature of the switch, a thermistor having a resistance varying with changes in the temperature, and battery state monitoring circuitry. The battery state monitoring circuitry may be configured to monitor a voltage drop across the switch caused by a current flowing through the switch and the resistance of the thermistor to correlate the voltage drop to the current.

According to yet another aspect of the invention there is provided a method. The method may include monitoring a voltage drop across a switch of a battery pack when the switch is closed, the having an ON resistance dependent on a temperature of the switch, and correlating the voltage drop to a current flowing through the switch by accounting for changes in the temperature.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
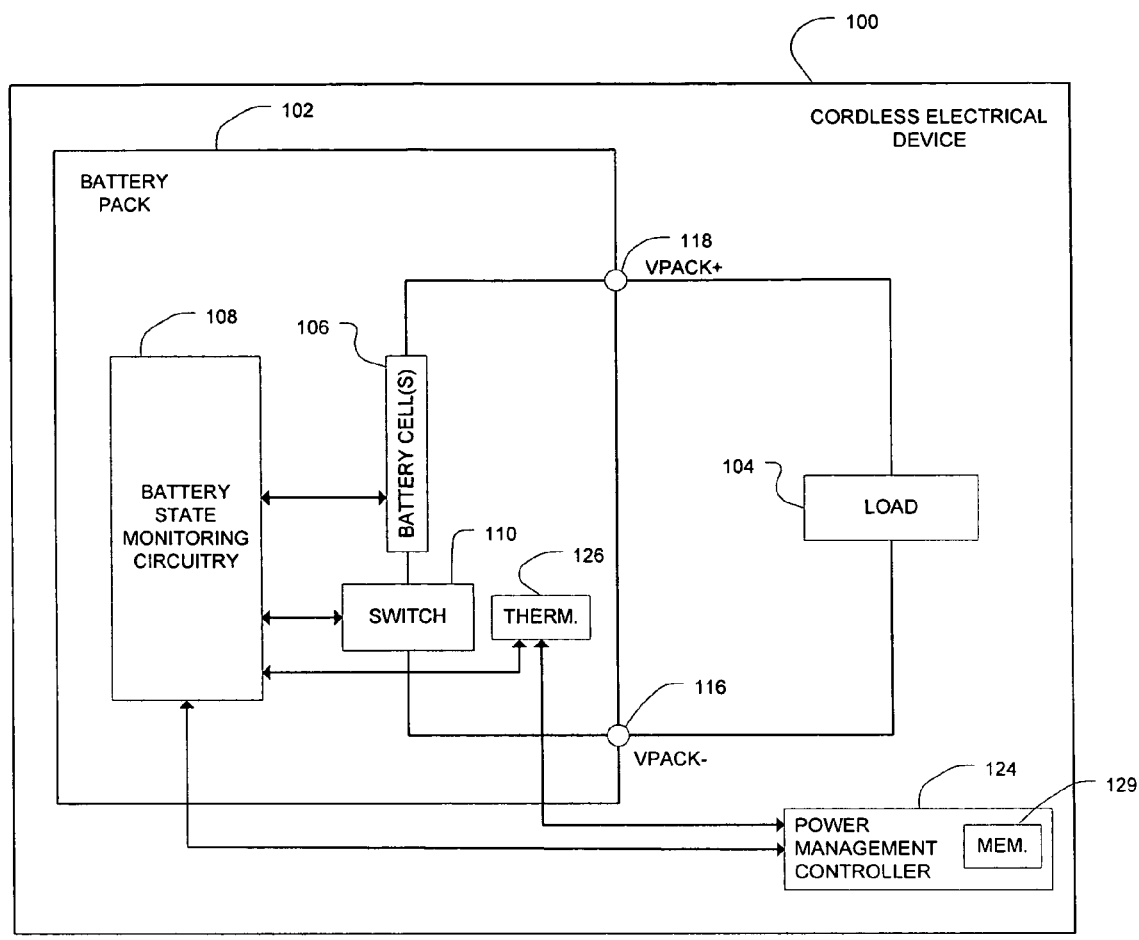
FIG. 1 is a diagram of a cordless electrical device having a battery pack with battery state monitoring circuitry.

FIG. 1 illustrates a cordless electrical device 100 having a battery pack 102 that may provide power to the load 104 during a battery supply mode. The load 104 may represent the entire load of the device 100 that may be coupled to the VPACK+ terminal 118 and the VPACK− terminal 116 of the battery pack 102. The cordless electrical device 100 may include, but not be limited to, a laptop computer, a cell phone, a personal digital assistant, and a power tool such as a drill, a circular saw, a sander, etc. In one embodiment, the load 104 may be the power tool itself when the cordless electrical device is a power tool. In addition to providing power to the load 104 in the battery supply mode, the battery pack 102 may also be recharged by a DC power source (not illustrated) such as an ACDC adapter which may also simultaneously provide power to the load 104. In other instances, the battery pack 102 may be readily removed from the cordless electrical device 100 and coupled to an external battery charger for charging purposes.

The battery pack 102 may include one or more battery cells 106, a switch 110 in series with the battery cells 106, a thermistor 126 located proximate the switch 110, and battery state monitoring circuitry 108. As used in any embodiment herein, "circuitry" may comprise, for example, singly or in any combination, hardwired circuitry, programmable circuitry, state machine circuitry, and/or firmware that stores instructions executed by programmable circuitry. The switch 110 may be a discharge switch that closes to provide a discharge path from the battery cells 106 to the load 104 or a charge switch that closes to provide a charge path from a charging source to the battery cells 106. The battery cells 106 may be any variety of battery chemistries such as lithium ion cells. The switch 110 may be a transistor such as a field effect transistor (FET).

In general, the battery state monitoring circuitry 108 may monitor the current flowing through the switch 110 by monitoring the voltage drop across the switch. The ON resistance of the switch 110 may vary with the temperature of the switch and hence affect the voltage drop across the switch. Therefore, the battery state monitoring circuitry 108 may correlate the voltage drop to a current flowing through the switch by accounting for changes in the temperature of the switch 110.

The current level flowing through the switch 110 may be representative of charging/discharging current of the battery cells 106.

The battery state monitoring circuitry 108 may also convert and send data regarding measurements as the charging/discharging current to the power management controller 124 of the associated cordless electrical device 100. The battery state monitoring circuitry 108 may also receive and execute instructions from the power management controller 124. The battery state monitoring circuitry 108 may also drive the switch 110 and other switches (not illustrated) of the battery pack 102 as instructed by the power management controller 124. When appropriate, the battery state monitoring circuitry 108 may also override instructions from the power management controller 124 and provide default states for the switches of the battery pack 102 when the power management controller 124 fails to send any control signals.

To monitor current to or from the battery cells 106, the battery state monitoring circuitry 108 may utilize the ON resistance of the switch 110. The switch 110 may have a particular ON resistance when the switch 110 is closed. The value of the ON resistance may vary with factors such as ambient temperature of the switch 110, the gain of the switch, and other particulars of the switch. The ON resistance of the switch 110 may vary proportionally with a change in temperature. As current flows through the switch 110, the ON resistance of the switch may cause a voltage drop across the switch in proportion to the current level.

To take into account factors affecting the ON resistance of the switch 110, a calibration may be performed to correlate factors such as both the initial gain and ambient temperature to the ON resistance. The measured correlation may be stored in memory such as a permanent memory 129 of the power management controller 124. The variation law can be introduced in the uC as function of temperature and compensate the current measurement value accordingly.

Figure 2:
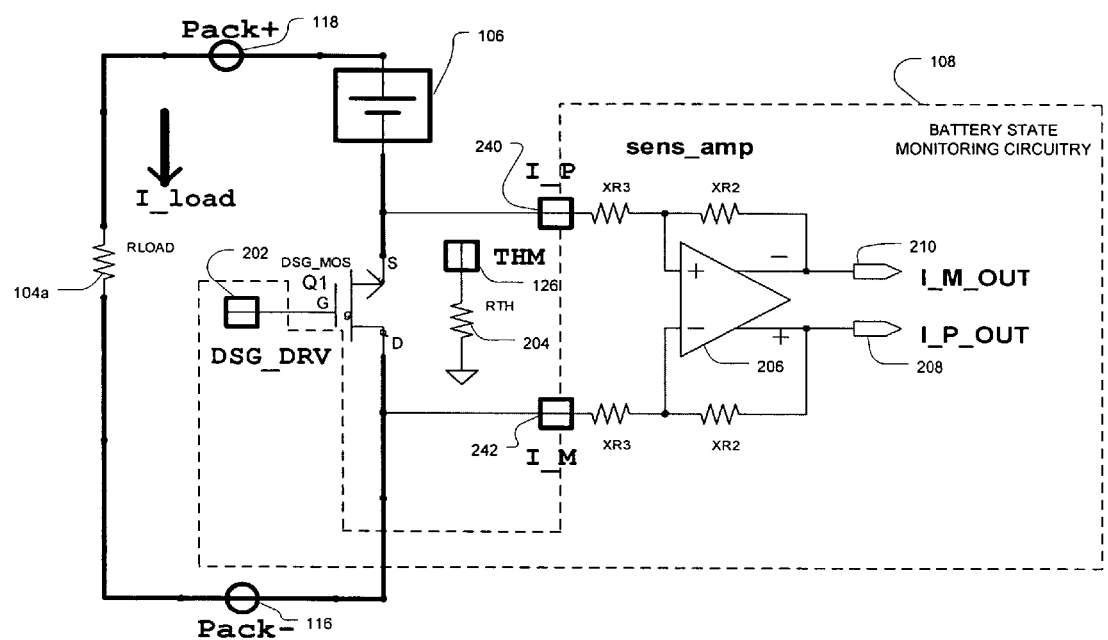
FIG. 2 is a diagram of battery state monitoring circuitry of FIG. 1 in more detail.

FIG. 2 illustrates the battery state monitoring circuitry 108 of the battery pack 102 of FIG. 1 in more detail. The battery state monitoring circuit 108 may include a sense amplifier 206 and a discharge driver 202. The battery pack 102 may have the thermistor 126 having a resistance 204 varying with changes in temperature. The switch 110 may be a discharge switch that closes to provide a discharge current to the load 104a, and the discharge switch may be implemented as a transistor such as a metal oxide semiconductor field effect transistor (MOSFET) Q1. The control or gate terminal of the MOSFET Q1 may receive a control signal from the discharge driver 202. The source of the MOSFET Q1 may be coupled to the I_P terminal 240 which may in turn be coupled to the noninverting input terminal of the sense amplifier 206. The drain of the MOSFET Q1 may be coupled to the I_M terminal 242 which in turn may be coupled to the inverting input terminal of the sense amplifier 206. The output of the sense amplifier 206 may be provided at the I_M_OUT terminal 210 and the I_P_OUT terminal 208.

In operation, as a discharge current (I_load) is provided to the load from the battery cells 106 a current may flow through the discharge MOSFET Q1. The ON resistance of the MOSFET may cause a voltage drop across the source and drain terminals. The voltage drop may be amplified by the sense amplifier 206 and provided at output terminals 210, 208 of the sense amplifier. In one embodiment, the battery monitoring circuitry 108 may analyze the signal from the I_M_OUT terminal 210 and the I_P_OUT terminal 208 of the sense amplifier 206 as well as the resistance 204 of the thermistor 126 to determine the discharge current in order to monitor the current level flowing through the MOSFET Q1. The thermistor 126 may be located proximate the MOSFET Q1 and may have a resistance 204 that varies rapidly and predictably with temperature.

The battery state monitoring circuitry 108 may also compare the discharge current from the battery cells 106 to a threshold level representative of a maximum discharge current level. If the battery state monitoring circuitry 108 detects the discharge current is greater than or equal to the maximum discharge current level, it may provide an output control signal to protect components of cordless electrical device. The output control signal may be provided to one or more switches in the battery pack 102 such as the MOSFET Q1 to open the MOSFET Q1 or may be provided to other circuitry located outside the battery pack 102 such as the power management controller 124.

Figure 3:
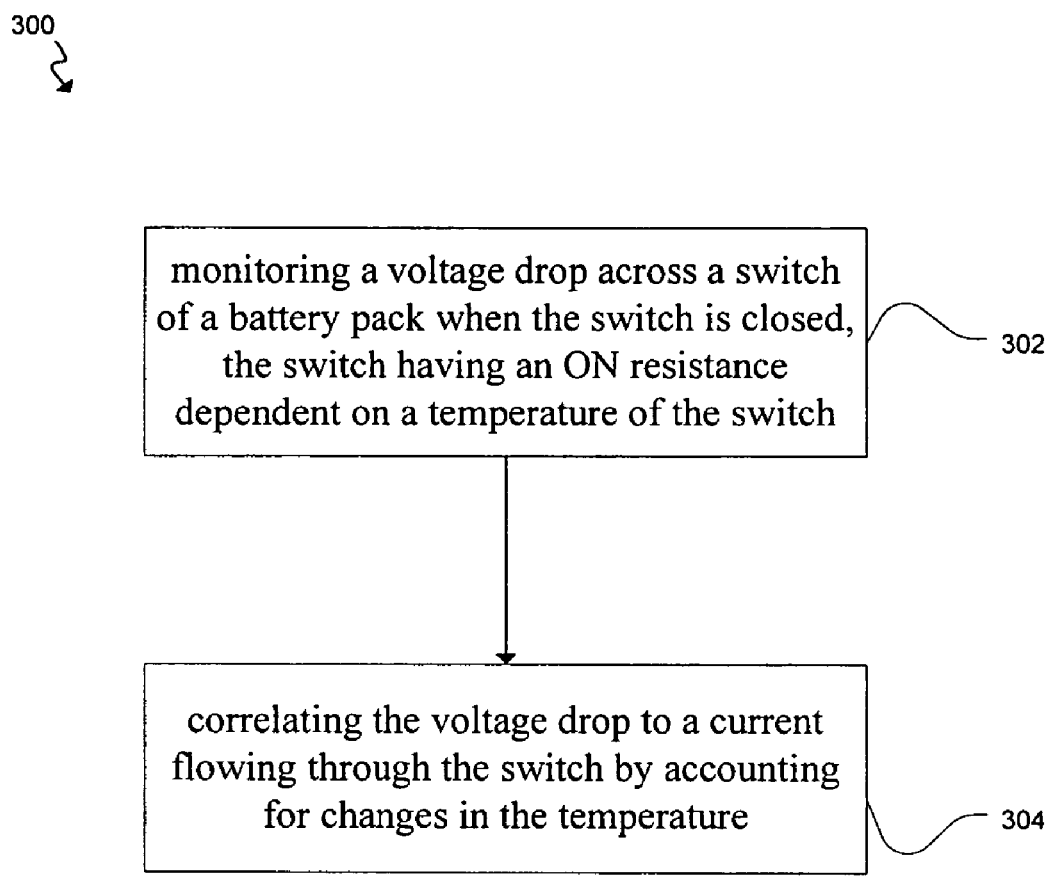
FIG. 3 is a flow chart of operations consistent with an embodiment.

FIG. 3 is a flow chart of operations 300 according to an embodiment. Operation 302 may include monitoring a voltage drop across a switch of a battery pack when the switch is closed, the switch having an ON resistance dependent on a temperature of the switch. Operation 304 may include correlating the voltage drop to a current flowing through the switch by accounting for changes in the temperature.

Advantageously, the need to utilize a conventional sense resistor to monitor current flowing from the battery cells or to the battery cells may be eliminated. This saves the cost of acquiring and connecting the sense resistor as well as eliminates the power dissipation losses caused by the sense resistor which can become significant as current levels are increased.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible.

What is claimed is:

1. An apparatus comprising:
   a battery pack comprising:
      at least one battery cell;
      a first and a second voltage terminal coupled to said at least one battery cell, said first and said second voltage terminals configured to be removably coupled to a load;
      a switch disposed between said at least one battery cell and at least one of said first and said second voltage terminals, said switch having an ON resistance dependent on a temperature of said switch;
      a thermistor located proximate said switch, said thermistor having a resistance varying with changes in said temperature, wherein said thermistor is configured to sense said temperature of said switch and to output a signal representative of said temperature of said switch; and
      battery state monitoring circuitry configured to determine a current flowing to or from said at least one battery cell based on a voltage drop across said switch caused by a current flowing through said switch and said signal from said thermistor representative of said temperature of said switch.

2. The apparatus of claim 1, wherein said switch comprises a discharge switch configured to close to enable said at least one battery cell to provide a discharge current to said load, said voltage drop representative of said discharge current.

3. The apparatus of claim 2, wherein said discharge switch comprises a metal oxide semiconductor field effect transistor (MOSFET) and said voltage drop is a voltage drop across a drain and source terminal of said MOSFET.

4. The apparatus of claim 3, wherein said battery state monitoring circuitry comprises a sense amplifier having one input coupled to said drain of said MOSFET and another input coupled to said source of said MOSFET, said sense amplifier configured to amplify said voltage drop across said drain and source terminal of said MOSFET and provide an output signal representative of said current flowing through said switch.

5. The apparatus of claim 1, wherein said switch comprises a charge switch configured to close to enable said at least one battery cell to be charged with a charge current from a charging source, said voltage drop representative of said charge current.

6. A cordless electrical device comprising:
a load; and
a battery pack to provide power to said load, said battery pack comprising:
    a first and a second voltage terminal configured to be removably coupled to said load;
    at least one battery cell configured to be coupled to said first and said second voltage terminals;
    a switch disposed between said at least one battery cell and at least one of said first and said second voltage terminals, said switch having an ON resistance dependent on a temperature of said switch;
    a thermistor having a resistance varying with changes in said temperature, wherein said thermistor is configured to sense said temperature of said switch and to output a signal representative of said temperature of said switch; and
    battery state monitoring circuitry configured to determine a current flowing to or from said at least one battery cell based on a voltage drop across said switch caused by a current flowing through said switch and said signal from said thermistor representative of said temperature of said switch.

7. The cordless electrical device of claim 6, wherein said thermistor is located proximate said switch.

8. The cordless electrical device of claim 6, wherein said switch comprises a discharge switch configured to close to enable said at least one battery cell to provide a discharge current to a load, said voltage drop representative of said discharge current.

9. The cordless electrical device of claim 8, wherein said discharge switch comprises a metal oxide semiconductor field effect transistor (MOSFET) and said voltage drop is a voltage drop across a drain and source terminal of said MOSFET.

10. The cordless electrical device of claim 9, wherein said battery state monitoring circuitry comprises a sense amplifier having one input coupled to said drain of said MOSFET and another input coupled to said source of said MOSFET, said sense amplifier configured to amplify said voltage drop across said drain and source terminal of said MOSFET and provide an output signal representative of said current flowing through said switch.

11. The cordless electrical device of claim 6, wherein said switch comprises a charge switch configured to close to enable said at least one battery cell to be charged with a charge current from a charging source, said voltage drop representative of said charge current.

12. A method comprising:
monitoring a voltage drop across a switch disposed between at least one battery cell and at least one of a first and a second voltage terminal of a battery pack when said switch is closed, said switch having an ON resistance dependent on a temperature of said switch;
sensing a temperature of said switch comprising monitoring a resistance of a thermistor as a function of temperature, said resistance of said thermistor representative of said temperature of said switch; and
determining a current flowing to or from said battery pack based on a voltage drop across said switch caused by a current flowing through said switch and said signal from said thermistor representative of said temperature of said switch.

13. The method of claim 12, wherein said current is further determined based on an initial gain of said switch.

14. The method of claim 12, wherein said switch comprises a discharge switch and said current comprises a discharge current flowing from said at least one battery cell of said battery pack to a load, said discharge switch comprising a metal oxide semiconductor field effect transistor (MOSFET) and said voltage drop being a voltage drop across a drain and source terminal of said MOSFET.

* * * * *